US007816924B2

(12) United States Patent
Kanazawa et al.

(10) Patent No.: US 7,816,924 B2
(45) Date of Patent: Oct. 19, 2010

(54) GAS INSULATED SWITCHGEAR AND METHOD FOR DETECTING ARC DAMAGE IN A GAS INSULATED SWITCHGEAR PART

(75) Inventors: Yukio Kanazawa, Yokohama (JP); Masahiro Hanai, Fujisawa (JP); Hiroshi Furuta, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 526 days.

(21) Appl. No.: 11/870,105

(22) Filed: Oct. 10, 2007

(65) Prior Publication Data

US 2008/0217297 A1 Sep. 11, 2008

(30) Foreign Application Priority Data

Oct. 12, 2006 (JP) ............................ 2006-279218

(51) Int. Cl.
*G01R 31/327* (2006.01)

(52) U.S. Cl. ...................................................... 324/415

(58) Field of Classification Search ................. 324/415, 324/420, 421, 456; 218/63
See application file for complete search history.

(56) References Cited

U.S. PATENT DOCUMENTS

| | | | | |
|---|---|---|---|---|
| 3,715,598 | A * | 2/1973 | Tomlin, Jr. | 250/395 |
| 4,975,800 | A * | 12/1990 | Oshita et al. | 361/113 |
| 5,453,591 | A * | 9/1995 | Stroud | 218/43 |
| 6,777,948 | B2 * | 8/2004 | Dominelli et al. | 324/455 |
| 6,884,998 | B2 * | 4/2005 | Nichols | 250/302 |
| 6,894,488 | B2 * | 5/2005 | Kikugawa et al. | 324/210 |
| 7,038,201 | B2 * | 5/2006 | Nichols | 250/302 |
| 7,053,625 | B2 * | 5/2006 | Dominelli et al. | 324/455 |
| 7,499,251 | B2 * | 3/2009 | Byron | 361/42 |
| 2004/0046563 | A1 | 3/2004 | Dominelli et al. | |
| 2005/0104598 | A1 * | 5/2005 | Dominelli et al. | 324/455 |

FOREIGN PATENT DOCUMENTS

| | | |
|---|---|---|
| JP | 06-014501 | 1/1994 |
| JP | 10-241481 | 9/1998 |
| JP | 11-354341 | 12/1999 |
| JP | 2005-071727 | 3/2005 |

* cited by examiner

*Primary Examiner*—John Fitzgerald
(74) *Attorney, Agent, or Firm*—Oblon, Spivak, McClelland, Maier & Neustadt, L.L.P.

(57) ABSTRACT

The invention provides a gas insulated switchgear, and a method for detecting arc damage in a part used in a gas insulated switchgear, which detect directly when an electric contact or a peripheral part reaches an initially set wear limit. An insulating nozzle of a circuit breaker contains a marking substance that releases a gaseous substance inside a circuit breaker gas container as a result of wear by an arc. For ensuring heat resistance and insulation properties, the insulating nozzle is ordinarily formed of a fluororesin, but in the present invention, it is formed of the ordinarily used fluororesin having uniformly mixed therein, as the marking substance, a chlorine-containing resin which has excellent heat resistance and insulation properties such as polyvinylidene chloride.

3 Claims, 5 Drawing Sheets

GAS INSULATED SWITCHGEAR AND METHOD FOR DETECTING ARC DAMAGE IN A GAS INSULATED SWITCHGEAR PART

BACKGROUND OF THE INVENTION

1. Field of the Invention

The present invention relates to a gas insulated switchgear and to a method for detecting arc damage in a part used in a gas insulated switchgear, and more particularly, to a gas insulated switchgear and a method for detecting arc damage in a gas insulated switchgear part, which detect easily when an electric contact reaches an originally set wear limit.

2. Description of the Related Art

Electrical contacts for switching an electric circuit are built into power equipment such as high-voltage circuit breakers, disconnectors or switches in power stations and/or substations. In the wake of the trend in recent years towards more compact power equipment, with a view to increasing economic efficiency and environmental compatibility, electric contacts tend to become smaller, but on the other hand, power equipment must cope with ever higher voltages and capacities, as a result of increased power demand, all of which results in smaller electric contacts supporting greater current densities.

In such power equipment, circuit breaking occurs repeatedly under high voltage, whereby the electric contacts vaporize and wear down as a result of the arc heat generated upon switching. Therefore it has been extremely important heretofore to grasp accurately the wear limit in an electric contact, to afford proper operation of the electric contact and to increase the utilization rate of the power equipment.

Methods for detecting the wear limit of an electric contact include, for instance, a method for detecting magnetic changes using a magnet mounted on a brush (Japanese Unexamined Patent Application Laid-open No. H06-14501), a method for monitoring voltage changes in a piezoelectric element mounted on an electric contact, and a method for detecting abnormal vibration or the like through mounting of a vibration sensor and/or an acceleration sensor on a switch (Japanese Unexamined Patent Application Laid-open Nos. H10-241481 and H11-354341). In these methods, a monitoring device detects anomalies by arranging a sensor or the like in the vicinity of a contact and by measuring changes in electric or mechanical characteristics.

A method has also been proposed in which wear can be detected, without mounting any special sensor or the like, by analyzing the light generated by the electrodes themselves during arc formation (Japanese Unexamined Patent Application Laid-open No. 2005-71727).

Conventional monitoring devices, such as those disclosed in Japanese Unexamined Patent Application Laid-open Nos. H06-14501, H10-241481 and H11-354341 measure deformation or changes in mechanical characteristics that are attributable to wear, at the initial stage of an anomaly. However, direct detection of wear limit of electrodes, nozzles or the like remained difficult in such monitoring devices.

The method in Japanese Unexamined Patent Application Laid-open No. 2005-71727, although suitable for detecting electrode wear, failed to detect wear of electrode-peripheral parts in a switch, such as a nozzle or the like.

SUMMARY OF THE INVENTION

The present invention is proposed in order to solve the above problems of conventional art. An object of the present invention is to provide a gas insulated switchgear, and a method for detecting arc damage in a part used in a gas insulated switchgear, which detect directly when an electric contact or a peripheral part reaches an originally set wear limit.

In order to accomplish the above object, the present invention is a gas insulated switchgear having, in a container where an arc-extinguishing gas is sealed, an arc-extinguishing chamber having a pair of arc contacts capable of contacting with/separating from each other, a puffer chamber having a puffer piston and a puffer cylinder provided on the side of one of the arc contacts, and a nozzle integrally fixed with puffer cylinder, such that compression of the puffer chamber causes the arc-extinguishing gas to be led to nozzle and blown onto an arc formed between pair of arc contacts, whereby the arc is extinguished; wherein a part making up arc contact, puffer chamber or arc-extinguishing chamber includes, as a marking substance, a substance including an element different from an element originally used for securing resistance or insulation resistance in the part, and marking substance is released in gaseous form into gas as part wears down through thermal decomposition by heat from arc.

In the present invention, therefore, a substance including an element different from an element used inside a switch is employed as a marking substance in a part used in a gas insulated switchgear, whereby the marking substance turns into gas through thermal decomposition and diffuses within a container when the part becomes worn by an arc generated upon the switching operation of the switch. By measuring the concentration of a gaseous marking substance in the gas within a gas insulated switchgear container, therefore, accurate limit evaluation of the wear of the gas insulated switchgear part becomes possible without dismantling and inspecting the equipment, and without using special diagnosis equipment such as X-ray transmission imaging or the like. The life of gas insulated switchgear parts can thus be evaluated easily.

The present invention allows thus providing a gas insulated switchgear, and a method for detecting arc damage in a part used in a gas insulated switchgear, which detect directly when an electric contact or a peripheral part reaches an originally set wear limit.

DESCRIPTION OF THE PREFERRED EMBODIMENTS

Figure 1:
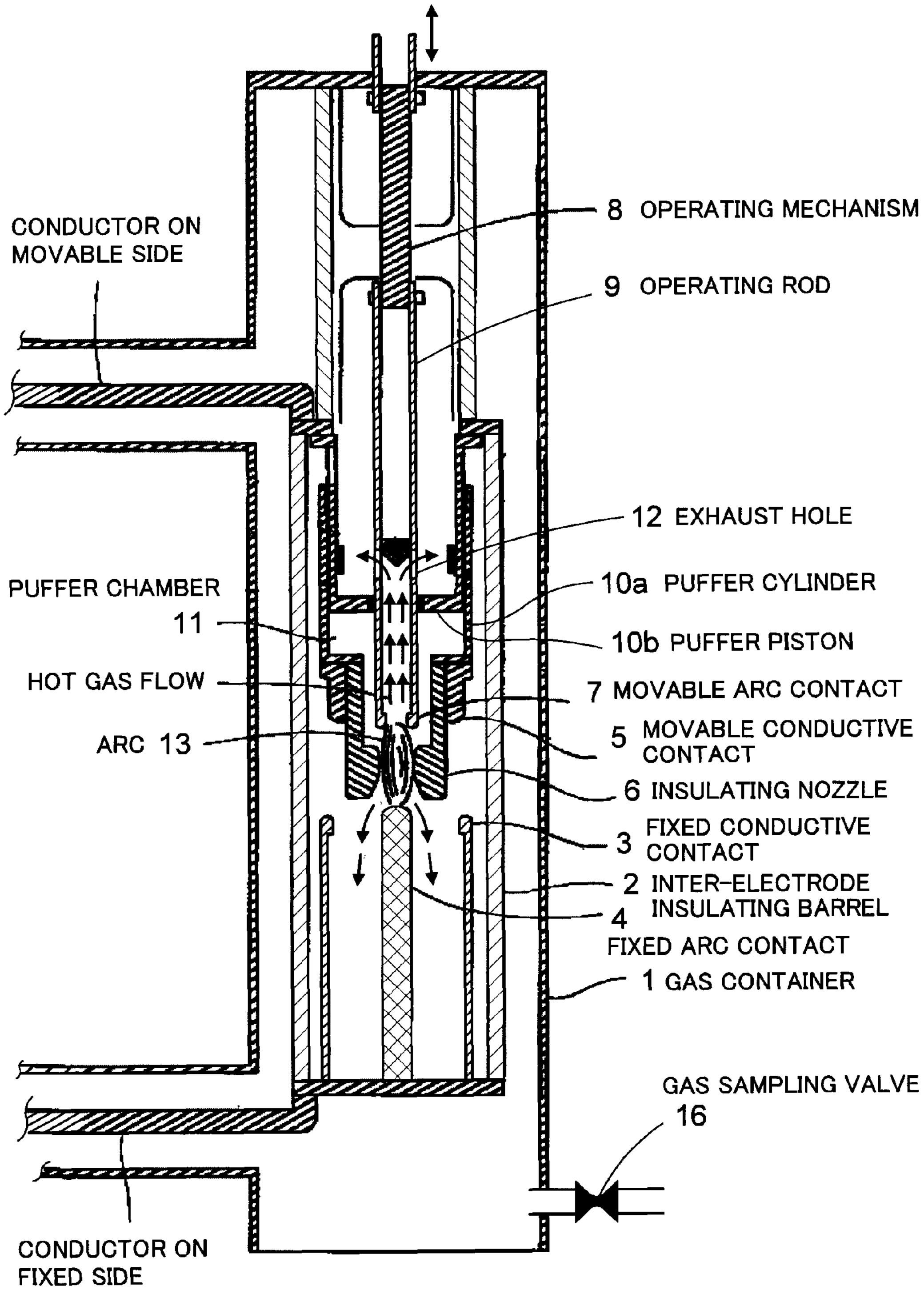
FIG. 1 is a diagram illustrating the basic constitution of a gas circuit breaker according to a first embodiment of the present invention.

Representative embodiments according to the present invention are explained in detail next with reference to FIGS. 1 through 3. A gas circuit breaker is explained below by way of examples, as an illustrative embodiment of the invention. However, the invention can be used not only in a gas circuit breaker, but also in a wide range of instances, in electric contacts for electric circuit switching in power equipment such as circuit breakers, disconnectors or switches, as well as in gas insulated switchgear parts.

(1) First Embodiment

A first embodiment of the present invention is explained next with reference to FIGS. 1 to 3. FIG. 1 illustrates the basic constitution of a gas circuit breaker according to the present embodiment.

Although the basic constitution of the gas circuit breaker according to the present embodiment is identical to that of a conventional gas circuit breaker, an explanation thereof follows next. Specifically, a hollow operating rod 9 joined to an operating mechanism 8 is provided in a gas container 1 inside which an arc extinguishing gas is sealed. The operating rod 9 is enveloped by a coaxial puffer cylinder 10*a*. A puffer piston 10*b* is inserted between the operating rod 9 and the puffer cylinder 10*a*. The puffer piston 10*b*, the puffer cylinder 10*a* and the operating rod 9 form a puffer chamber 11 that is surrounded by the foregoing.

A movable arc contact 7 is arranged at the end portion of the operating rod 9. At the opposite position of the movable arc contact 7 in the operating rod 9 there are provided lateral exhaust holes 12. An insulating nozzle 6 having a gas channel and a movable conductive contact 5 are also provided on the outer periphery of the movable arc contact 7. At a position opposite the movable arc contact 7 there is disposed a fixed arc contact 4, outward of which there is arranged a fixed conductive contact 3.

In a gas circuit breaker having the above constitution, a circuit-breaking operation of the operating rod 9, acted upon by the operating member 8, causes the fixed conductive contact 3 and the movable conductive contact 7 to separate, after which an arc 13 forms between the fixed arc contact 4 and the movable arc contact 7. The surrounding parts become exposed to high temperatures on account of the arc, and undergo as a result substantial wear.

Figure 2:
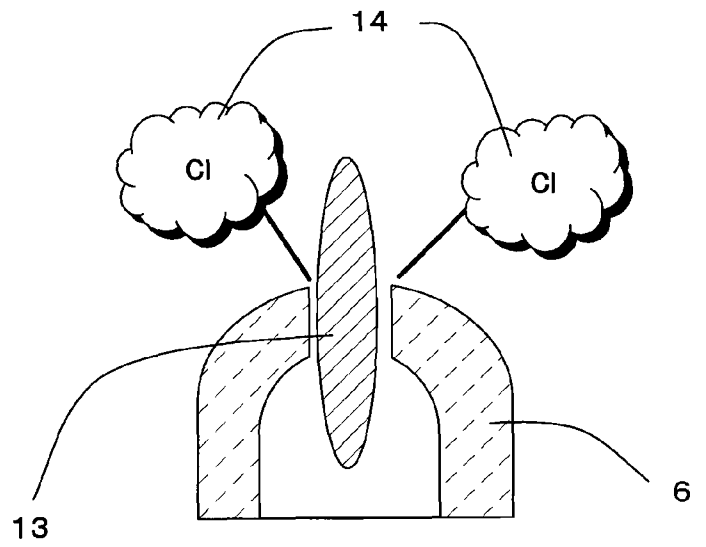
FIG. 2 is a conceptual diagram representing wear detection in an insulating nozzle according to the first embodiment of the present invention.
Figure 3:
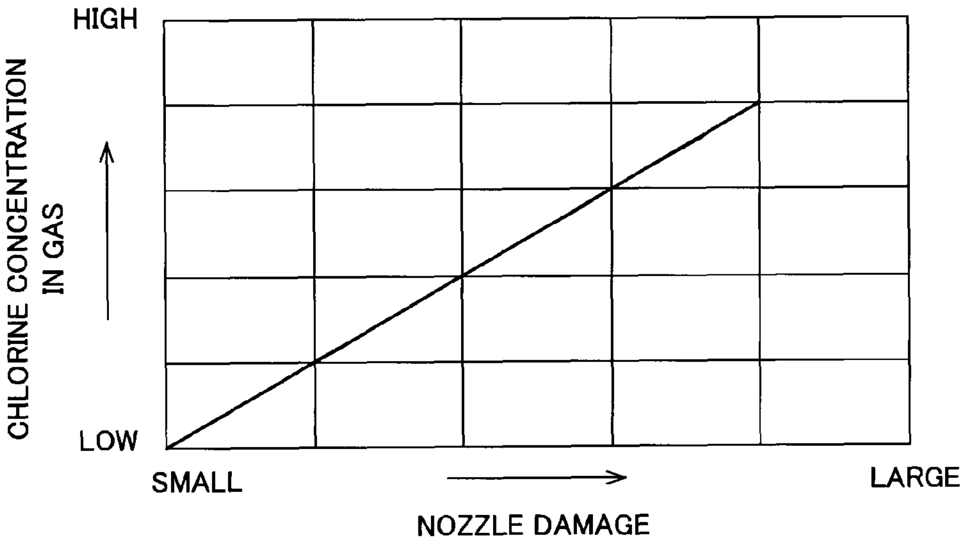
FIG. 3 is a graph illustrating the relationship between the concentration of a marking substance in a gas and the degree of wear of an insulating nozzle in the first embodiment according to the present invention.

In the present embodiment, as the conceptual diagram of FIG. 2 illustrates, the insulating nozzle 6 of such a circuit breaker includes thus a marking substance 14 that is released in the form of a gaseous substance inside the gas container 1 as a consequence of wear by the arc 13.

For ensuring heat resistance and insulation properties, the insulating nozzle 6 is ordinarily formed of a fluororesin. In the present embodiment, the insulating nozzle 6 is formed of ordinarily used fluororesin having uniformly mixed therein, as the marking substance 14, a chlorine-containing resin which has excellent heat resistance and insulation properties such as polyvinylidene chloride. Thus, a substance including chlorine (Cl), which is an element different from the element used inside a circuit breaker, is employed as the marking substance 14.

In the present embodiment, a gas sampling valve 16 for sampling gas inside the gas container 1 is provided at a predetermined location of the gas container 1, for example on the side of a fixed conductor, in the present case. Gas inside the gas container 1 is sampled through opening and closing of the valve 16, so as to detect the components of the gas.

In the present embodiment, thus, the parts that make up the circuit breaker become worn on account of the arc 13 that forms between the fixed arc contact 4 and the movable arc contact 7 through the circuit-breaking operation of the operating mechanism 8 and the operating rod 9. Since in the insulating nozzle 6 there is employed herein, as a marking substance, a substance including an element that is different from the element originally used in the circuit breaker, the gaseous marking substance 14 accumulates then inside the gas container 1 in a gradually increasing concentration that is directly proportional to wear progression.

More specifically, when the insulating nozzle 6 wears down as a result of the heat of the arc 13, the chlorine-containing resin that is uniformly mixed with the fluororesin ordinarily used in the insulating nozzle 6 generates gaseous chlorine through thermal decomposition. This chlorine is a gas, and hence it accumulates gradually in the circuit breaker, with a rising concentration as illustrated in FIG. 3.

The gas inside the gas container 1 is sampled then via the gas sampling valve 16, and the concentration of the marking substance 14 included in that gas is monitored by an analyzer not shown in the figure. The marking substance 14 can be determined even in small amounts, since, as explained above, the substance used includes an element that is different from the elements originally used inside the circuit breaker. A wear limit can also be assessed herein by setting a wear limit of the insulating nozzle 6, as a predetermined limit concentration.

Accurate limit evaluation of the wear of circuit breaker parts, such as the insulating nozzle 6, becomes possible without dismantling and inspecting the equipment, and without using special diagnosis equipment such as X-ray transmission imaging or the like. The life of circuit breaker parts can thus be evaluated easily.

Methods that can be used for analyzing the marking substance included in the sampled gas include, for instance, gas chromatography or detector tube, when the concentration of the marking substance in the gas is relatively high and/or when part of the gas can be sampled, or other chemical analysis methods such as ion chromatography, titration or colorimetry when the concentration of the marking substance in the gas is relatively low but gas can be sampled in large amounts, by causing the gas to pass through water or an absorbing solution in which chlorine becomes absorbed. Mass spectrometry or gas chromatograph mass spectrometry can be used when the sampling amount is almost zero.

The timing of such analysis is not particularly limited, but the analysis is preferably carried out basically after the circuit-breaking operation, since the release of the marking substance 14 by the insulating nozzle 6 is caused by the formed arc 13.

A constitution identical to that of the present embodiment can also be used overall for parts that employ organic materials that become damaged by the arc 13, for instance circuit breaker parts such as an inter-electrode insulating barrel 2 and the like, whereby an effect identical to that of the insulating nozzle can be achieved.

(2) Second Embodiment

A second embodiment of the present invention is explained next with reference to FIGS. 4 and 5. Constitutions identical to those of the first embodiment are denoted with identical reference numerals, omitting herein a repeated explanation thereof.

Figure 4:
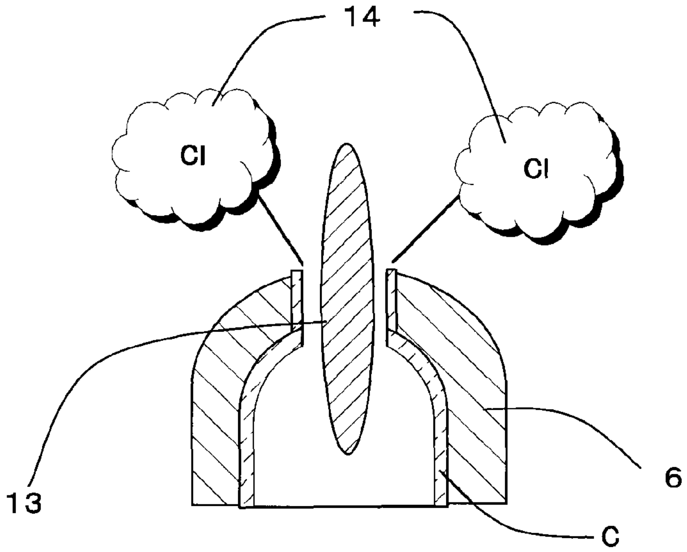
FIG. 4 is a conceptual diagram representing wear detection in an insulating nozzle according to a second embodiment of the present invention.

In the present embodiment, a gas circuit breaker having the same basic constitution as that of the first embodiment has an improved insulating nozzle 6, as illustrated in FIG. 4. Specifically, on the insulating nozzle 6 there is provided a fluororesin layer P made of a fluororesin identical to a conventional one, from the exterior of the insulating nozzle 6 to a thickness set to the wear limit, while a chlorine-containing resin layer C made of a chlorine-containing resin, that is herein the marking substance 14, is provided at a position that is set to the wear limit of the inner cladding of the insulating nozzle 6.

Figure 5:
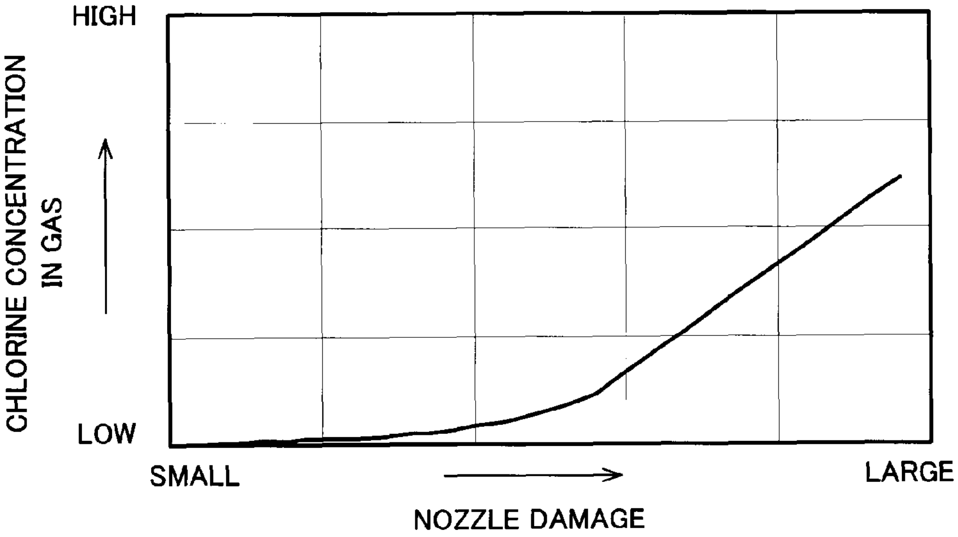
FIG. 5 is a graph illustrating the relationship between the concentration of a marking substance in a gas and the degree of wear of an insulating nozzle in the second embodiment according to the present invention.

In the present embodiment, thus, by using a nozzle formed by a fluororesin such as polytetrafluoroethylene (PTFE) or the like that does not include the marking substance 14, up to the wear limit, the chlorine concentration in the gas, which is the concentration of the marking substance 14, does not increase in direct proportion to the extent of wear of the insulating nozzle 6, as illustrated in FIG. 5, but increases only slightly. The concentration of chlorine in the gas rises then abruptly at the stage when wear in the insulating nozzle 6 reaches the chlorine-containing resin layer C, which is the wear limit.

By setting that point as the wear limit and by detecting the latter, accurate limit evaluation of the wear of circuit breaker parts, such as the insulating nozzle 6, becomes possible without dismantling and inspecting the equipment, and without using special diagnosis equipment such as X-ray transmission imaging or the like. The life of circuit breaker parts can thus be evaluated easily.

(3) Third Embodiment

A third embodiment of the present invention is explained next with reference to FIGS. 6 and 7. Constitutions identical to those of the above embodiments are denoted with identical reference numerals, omitting herein a repeated explanation thereof.

Figure 6:
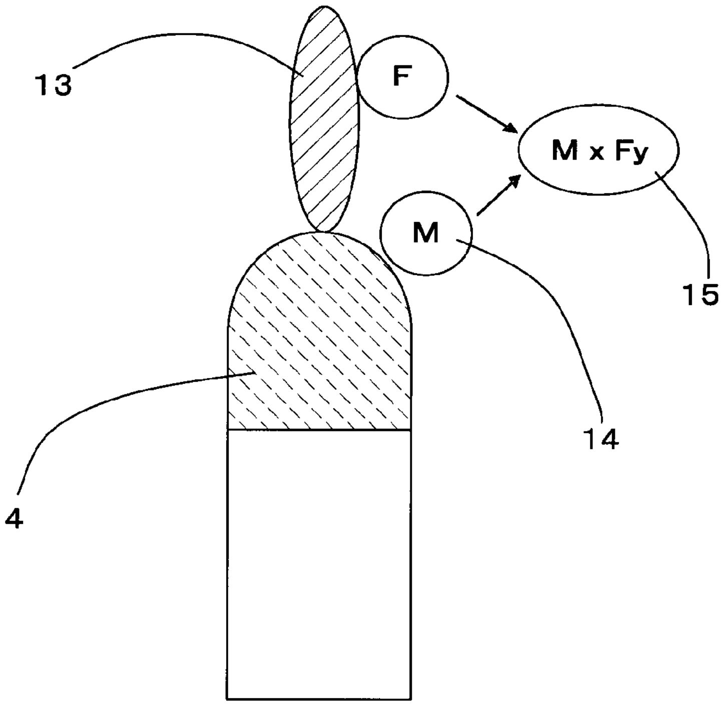
FIG. 6 is a conceptual diagram representing wear detection in an insulating nozzle according to a third embodiment of the present invention.

The gas circuit breaker of the present embodiment has the same basic constitution as that of the first embodiment, but herein the marking substance 14 is mixed into the fixed arc contact 4 in order to detect damage in the arc contact as shown in FIG. 6 being a conceptual diagram.

Arc contacts suffer normally substantial wear through exposure to high temperatures, and hence materials having good heat resistance, often a Cu—W alloy, for instance, are used as a contact material in the arc contacts. In the present embodiment, however, a substance that forms a fluoride through reaction with fluorine or hydrofluoric acid is used in the fixed arc contact 4 as the marking substance M. Specifically, Se, Ge or Te can be suitably used as fluoride-forming substances for generating a gaseous fluoride 15 at room temperature, while Sb, Os, Cr, Re or V can be suitably used as fluoride-forming substances for generating a fluoride 15 having a relatively low boiling point.

When in the above embodiment $SF_6$ gas is used as the insulating gas in the gas container 1, the arc 13 that forms upon circuit breaking causes the $SF_6$ gas to decompose, with fluorine or hydrofluoric acid F being formed as a result. In the fixed arc contact 4, meanwhile, the formed arc 13 causes similarly the release of a vaporized component of the fluoride-forming substance included in the contact, as the marking substance M. The fluoride 15 forms then through reaction of the fluorine or hydrofluoric acid F and Se, Ge, Te or Sb, Os, Cr, Re, V as the marking substance.

Figure 7:
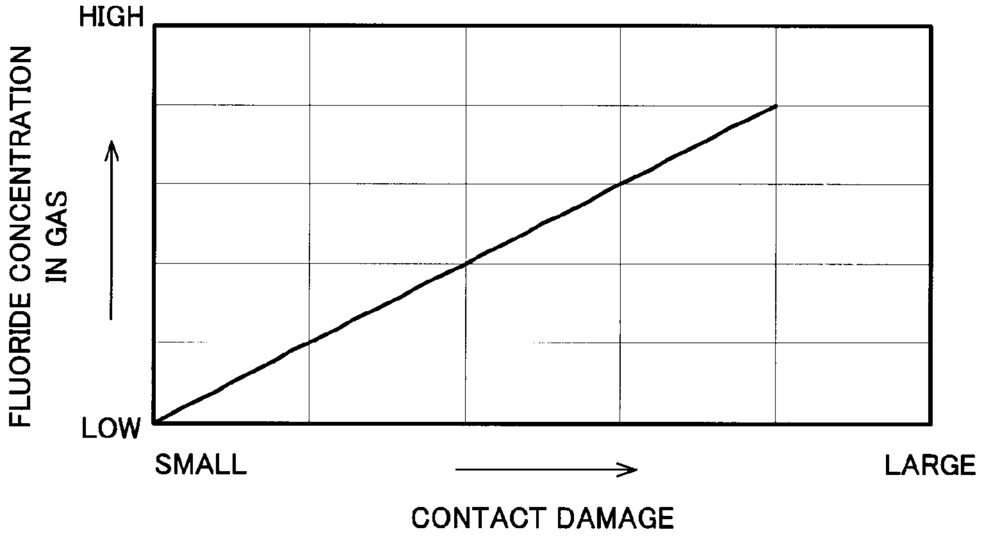
FIG. 7 is a graph illustrating the relationship between the concentration of a fluoride in a gas and the degree of wear of an arc contact in the third embodiment according to the present invention.

As illustrated in FIG. 7, the fluoride 15 accumulates then inside the gas container 1 in a gradually increasing concentration that is directly proportional to wear progression. Thus, the concentration of the fluoride 15 in the gas can be analyzed in accordance with the same procedure as in the first embodiment, i.e. by sampling the gas in the device and detecting the gas by gas chromatography, when gaseous fluoride 15 is formed, or by sampling the gas in the gas container 1 through reaction of the gas with an absorbing solution and subsequent analysis of the marking element concentration in the absorbing solution. A wear limit can also be assessed herein by measuring changes in that concentration and by setting beforehand a limit concentration that is equivalent to the wear limit.

Accurate limit evaluation of the wear of circuit breaker parts, such as fixed arc contacts, becomes thereby possible without dismantling and inspecting the equipment, and without using special diagnosis equipment such as X-ray transmission imaging or the like. The life of circuit breaker parts can thus be evaluated easily.

In the present embodiment, the fluoride 15 may liquefy or solidify when the gas temperature in the gas container 1 drops, but in such cases the wear limit of the arc contacts can be determined by arranging a surface resistance sensor inside the device and by measuring resistance changes in the sensor.

In the third embodiment, the explanation of the arc contact containing the marking substance has been restricted to the fixed arc contact, but the explanation holds likewise, as is, if the movable arc contact takes the place of the fixed arc contact, to afford the same effect as in the case of the fixed arc contact.

(4) Fourth Embodiment

A fourth embodiment of the present invention is explained next with reference to FIGS. 8 and 9. Constitutions identical to those of the above embodiments are denoted with identical reference numerals, omitting herein a repeated explanation thereof.

Figure 8:
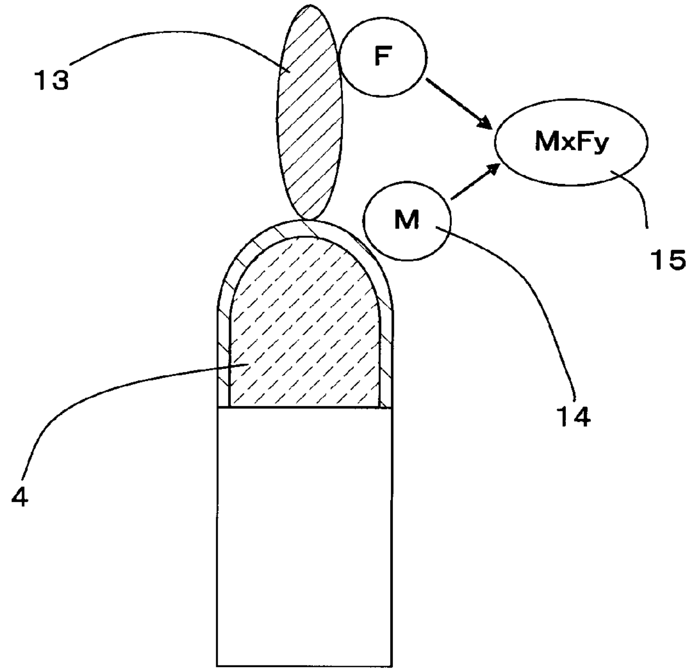
FIG. 8 is a conceptual diagram representing wear detection in an insulating nozzle according to a fourth embodiment of the present invention.

In the present embodiment, a gas circuit breaker having the same basic constitution as that of the first embodiment has a fixed arc contact 4 having the improved constitution described in the third embodiment, and as illustrated in the conceptual diagram of FIG. 8. Specifically, the fixed arc contact 4 has provided thereon a layer that does not include a marking substance, such as a Cu-W alloy similar to conventional ones, from the exterior of the fixed arc contact 4 to a thickness set as the wear limit, while a marking layer L made of a fluoride-forming substance such as Se, Ge, Te or Sb, Os, Cr, Re, V, as the marking substance 14, is provided on the inner-cladding side of the fixed arc contact 4 inward than the position that corresponds to the wear limit.

Figure 9:
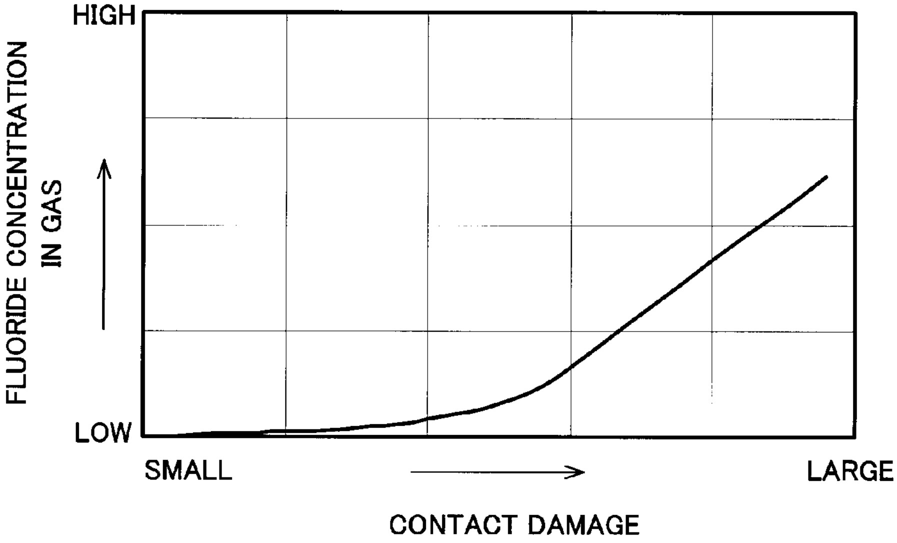
FIG. 9 is a graph illustrating the relationship between the concentration of a fluoride in a gas and the degree of wear of an arc contact in the fourth embodiment according to the present invention.

In the present embodiment, thus, by using a layer that does not include the marking substance 14, up to the wear limit, the concentration of fluoride 15 described in the third embodiment, which is the concentration of the marking substance 14 in the gas, does not increase in direct proportion to the extent of wear of the fixed arc contact 4, as illustrated in FIG. 9, but increases only slightly. The concentration of fluoride 15 in the gas rises abruptly then at the stage when wear in the fixed arc contact 4 reaches the marking layer L, which is the wear limit.

By setting that point as the wear limit and by detecting the latter, accurate limit evaluation of the wear of circuit breaker parts, such as the fixed arc contact 4, becomes possible without dismantling and inspecting the equipment, and without using special diagnosis equipment such as X-ray transmission imaging or the like. The life of circuit breaker parts can thus be evaluated easily.

What is claimed is:

1. A method for detecting arc damage in a gas insulated switchgear part making up an arc-extinguishing chamber which is arranged in a container where an arc-extinguishing gas is sealed, and which has a pair of arc contacts capable of contacting with/separating from each other, a puffer chamber formed by a puffer piston and a puffer cylinder provided on the side of one of the arc contacts, or a nozzle integrally fixed with said puffer cylinder, Wherein said part includes, as a marking substance, a substance including an element different from an element originally used for securing resistance or insulation resistance in the part, and the method comprises the step of determining a wear limit of said part by detecting the concentration, in the gas within said container, of said marking substance released in gaseous form as said part wears down through thermal decomposition by heat from an arc formed between said pair of arc contacts as a result of a switching operation.

2. The method for detecting arc damage in a gas insulated switchgear part according to claim 1, said gas insulated switchgear, wherein $SF_6$ gas is used as an extinguishing gas sealed in said container, said arc contact has mixed therein a material including a component that generates a low-boiling-point or sublimable fluoride through reaction with a decomposition component of said $SF_6$ gas resulting from thermal decomposition by heat from said arc, and the method comprises the step of determining a wear limit of said arc contact by detecting the concentration, in the gas within said container, of said fluoride generated as said part wears down through thermal decomposition by heat from an arc formed between said pair of arc contacts as a result of a switching operation.

3. The method for detecting arc damage in a gas insulated switchgear part according to claim 2, comprising the step of determining a wear limit of said arc contact by measuring a change in resistance in said container when said fluoride solidifies or liquefies through a drop in temperature within said container after arc generation, using a surface resistance sensor, provided in said container, for measuring the amount of generated fluoride.

* * * * *